(12) United States Patent
Huang

(10) Patent No.: US 7,075,977 B2
(45) Date of Patent: Jul. 11, 2006

(54) CIRCUIT FOR A TRANSCEIVER OUTPUT PORT OF A LOCAL AREA NETWORKING DEVICE

(75) Inventor: Chen-Chih Huang, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 34 days.

(21) Appl. No.: 10/937,189

(22) Filed: Sep. 9, 2004

(65) Prior Publication Data

US 2005/0053161 A1 Mar. 10, 2005

Related U.S. Application Data

(63) Continuation-in-part of application No. 09/447,709, filed on Nov. 23, 1999, now Pat. No. 6,795,493.

(51) Int. Cl.
*H04B 1/38* (2006.01)
*H04L 12/00* (2006.01)

(52) U.S. Cl. .................... 375/219; 307/53
(58) Field of Classification Search ............ 307/43, 307/401, 71, 64, 412, 53, 65, 44; 375/219; 326/62, 82, 30, 86; 327/108; 340/538.14, 340/538, 533, 531, 500; 333/17.3, 17.1, 333/124, 100, 1; 379/394, 398, 387.01; 370/395.5, 370/395.1, 389, 351, 395.53
See application file for complete search history.

(56) References Cited

U.S. PATENT DOCUMENTS

| | | | | |
|---|---|---|---|---|
| 4,591,739 A | * | 5/1986 | Nagano | 323/311 |
| 5,081,423 A | | 1/1992 | Koyama et al. | 327/341 |
| 5,436,934 A | | 7/1995 | Co | 375/351 |
| 5,818,269 A | | 10/1998 | Brown et al. | 327/108 |
| 6,121,793 A | | 9/2000 | Pickering et al. | 326/73 |
| 6,215,816 B1 | | 4/2001 | Gillespie et al. | 375/219 |
| 6,313,670 B1 | | 11/2001 | Song et al. | 327/108 |
| 6,393,062 B1 | | 5/2002 | Furman et al. | 375/252 |
| 6,411,647 B1 | | 6/2002 | Chan | 375/216 |

* cited by examiner

*Primary Examiner*—Pankaj Kumar
(74) *Attorney, Agent, or Firm*—Thomas, Kayden, Horstemeyer & Risley

(57) ABSTRACT

A driving circuit for a transceiver output port of a local area networking device is provided, including first and second current sources coupled to the ground, first and second resistors coupled to the supply voltage with the resistances of the first and second resistors each being equal to half that of the equivalent resistance of the cable for the purpose of impedance matching, and third and fourth current sources coupled to the cable for providing additional currents while the first and second current sources are operating such that the magnitude of the differential output signal is determined not only according to the first and second currents but also according to the third and fourth currents.

25 Claims, 11 Drawing Sheets

CIRCUIT FOR A TRANSCEIVER OUTPUT PORT OF A LOCAL AREA NETWORKING DEVICE

This is a continuation-in-part of application Ser. No. 09/447,709, filed on Nov. 23, 1999, now U.S. Pat. No. 6,795,493, the subject matter of which is incorporated herein by reference.

BACKGROUND OF THE INVENTION

1. Field of the Invention

The present invention relates to a local area networking device, especially to a driving circuit for a transceiver output port of local area networking device.

2. Description of the Related Art

The IEEE announced an IEEE 802.3 standard for Ethernet communication system. According to the IEEE 802.3 standard, the transceiver output port of each local area networking device is coupled to other local area networking devices via a unshielded twisted pair (UTP) cable. The data outputted from the transceiver output port is in the form of a differential output signal. In a 10 Mbps Ethernet communication system, for example, the peak-to-peak magnitude of the differential output signal $V_{PP}$ is from ±2.2V to ±2.8V as illustrated in FIG. 1. The differential output signal of the transceiver output port 21 is transmitted to a twisted-pair cable 22 via the transformer 23, as illustrated in FIG. 2.

FIG. 3 shows a conventional circuit of a transceiver output port for communicating with the UTP cable. The circuit includes two current sources: $I_1$ and $I_2$, which are serially-connected to the resistors $R_1$ and $R_2$ respectively. The other ends of the resistors $R_1$ and $R_2$ are connected to a common supply voltage $V_{DD}$. A differential voltage ($V^+ - V^-$) appears between the nodes x and y, which have voltages $V^+$ and $V^-$ respectively. An equivalent load resistance $R_L$ appears between the nodes x and y.

The advantage for the circuit as illustrated in FIG. 3 is that the power consumption of the circuit can be decreased when the circuit is in idle state. When there is no signal output from the transceiver output port (i.e., the transceiver output port is idle), the current sources $I_1$, and $I_2$ can be off in order to save the power consumption. However, due to the inductance of the transformer coil, it takes a period of time for the transformer coil to be fully charged every time after the current sources $I_1$, and $I_2$ are on. The time required is determined by the inductance of the transformer coil and the resistance of the resistors $R_1$ and $R_2$. Consequently, in order to reduce the time delay as mentioned in the above, the current sources $I_1$, and $I_2$ cannot be off even in idle state in practical application. That is, the magnitudes of the output currents of the current sources $I_1$ and $I_2$ cannot be zero even the transceiver is in idle state.

Although the power consumption of the conventional circuit as shown in FIG. 3 can be decreased, the power consumption is still considerably large since the magnitudes of the output currents of the current sources $I_1$, and $I_2$ must be large enough to drive the transceiver output port to output the differential output signal. Moreover, the conventional circuit is not applicable under low supply voltage, which is explained as follows. Referring to FIG. 3, $R_L$ is the equivalent load resistance of the UTP cable, and $R_1$ and $R_2$ are the impedance match resistors for matching the impedance of the UTP cable. According to IEEE 802.3 standard, $R_L$=100 Ω and $R_1$=$R_2$=50 Ω. In the following explanation, the resistance of the resistors $R_1$ and $R_2$ are both represented by R and the resistance of $R_L$ can be represented by 2R. Accordingly, the following equations can be derived:

$$I_1 + I_2 = I \quad (1)$$

$$\frac{V_{DD} - V^-}{R} + \frac{V^+ - V^-}{2R} = I_1 \quad (2)$$

$$\frac{V_{DD} - V^+}{R} - \frac{V^+ - V^-}{2R} = I_2 \quad (3)$$

wherein I is a constant.

From the equations (2) and (3), equation (4) can be derived as follows:

$$\Rightarrow \frac{2V_{DD} - (V^+ + V^-)}{R} = I \quad (4)$$
$$\Rightarrow V^+ + V^- = 2V_{DD} - RI$$
$$\Rightarrow V^- = 2V_{DD} - RI - V^+$$

Based on equation (2) and equation (4), equation (5) is generated as follows:

$$\Rightarrow \frac{2V_{DD} - 2(2V_{DD} - RI - V^+) + V^+ - (2V_{DD} - RI - V^+)}{2R} = I_1 \quad (5)$$
$$\Rightarrow -4V_{DD} + 4V^+ + 3RI = 2RI_1$$

Based on equations (1) and (5), equation (6) is obtained to represent $V^+$ as follows:

$$\Rightarrow V^+ = V_{DD} - \frac{1}{4}RI_1 - \frac{3}{4}RI_2 \quad (6)$$

Furthermore, based on equations (4) and (6), equation (7) is obtained to represent $V^-$ as follows:

$$\Rightarrow V^- = V_{DD} - \frac{3}{4}RI_1 - \frac{1}{4}RI_2 \quad (7)$$

The differential voltage ($V^+ - V^-$) can then be represented by equation (8) according to equations (6) and (7) as follows:

$$\Rightarrow V^+ - V^- = \frac{R}{2}(I_1 - I_2) \quad (8)$$

In a 10 Mbps Ethernet communication system, for example, the peak-to-peak magnitude of the differential output signal $V_{PP}$ is from ±2.2V to ±2.8V. If the differential output signal $V_{PP}$ is positive ($V^+ > V^-$), an inequality (9) can be derived from the equation (8):

$$2.2 \leq V^+ - V^- = \frac{R}{2}(I_1 - I_2) \leq 2.8 \Rightarrow \quad (9)$$

-continued $$\frac{4.4}{R} + I_2 \le I_1 \le \frac{5.6}{R} + I_2,$$

and another inequality (10) can be derived from equation (7):

$$V^- = V_{DD} - \frac{3}{4}RI_1 - \frac{1}{4}RI_2 \ge 0 \Rightarrow V_{DD} \ge \frac{R}{4}(3I_1 + I_2) \quad (10)$$

Based on inequalities (9) and (10), the following inequality can be obtained:

$$V_{DD} \ge \frac{R}{4}\left(3 \times \frac{4.4}{R} + 3I_2 + I_2\right) = 3.3 + RI_2$$

As a result, the supply voltage $V_{DD}$ has a minimum value of 3.3V when $I_2=0$. Therefore, the supply voltage $V_{DD}$ cannot be further reduced if the same amplitude of the differential output signal is to be kept. In other words, the conventional circuit for a transceiver output port at least has the following disadvantages:

1. The power consumption to drive the transceiver output port is still considerably too large.
2. Magnitude of the supply voltage $V_{DD}$ must also be large. For example, in a 10 Mbps Ethernet communication system, the supply voltage $V_{DD}$ must be larger than 3.3V to maintain the magnitude of the differential output signal to be within a predetermined range.

SUMMARY OF THE INVENTION

Therefore, it is one of the objectives of the present invention to provide a circuit for a transceiver output port of a local networking device, wherein the power consumption can be further decreased.

In addition, it is another one of the objectives of the present invention to provide a circuit for a transceiver output port of a local networking device, wherein the circuit can operate particularly at a supply voltage with the magnitude lower than the conventional supply voltage.

According to the objectives of the present invention, a driving circuit of a transceiver output port of a local area networking device is disclosed. The transceiver output port is coupled to a cable, such as an unshielded twisted pair (UTP), shielded twisted pair (STP), or the like, and the driving circuit is for outputting a differential output signal to the cable. The transceiver output port driving circuit comprises a first output node and a second output node for outputting the differential output signal; a first current source coupled to the first output node for providing a first current; a second current source coupled to the second output node for providing a second current; a first resistor coupled to the first output node; a second resistor coupled to the second output node; a third current source coupled between the first output node and a supply voltage source for providing a third current; and a fourth current source coupled between the second output node and the supply voltage source for providing a fourth current.

The resistance of the first resistor and the second resistor each are equal to ½ of the equivalent resistance of the cable for the purpose of impedance matching to the cable.

The third and fourth current sources are for providing additional currents while the first and second current sources are operating such that the magnitude of the differential output signal is determined not only according to the first and second currents but also according to the third and fourth currents.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
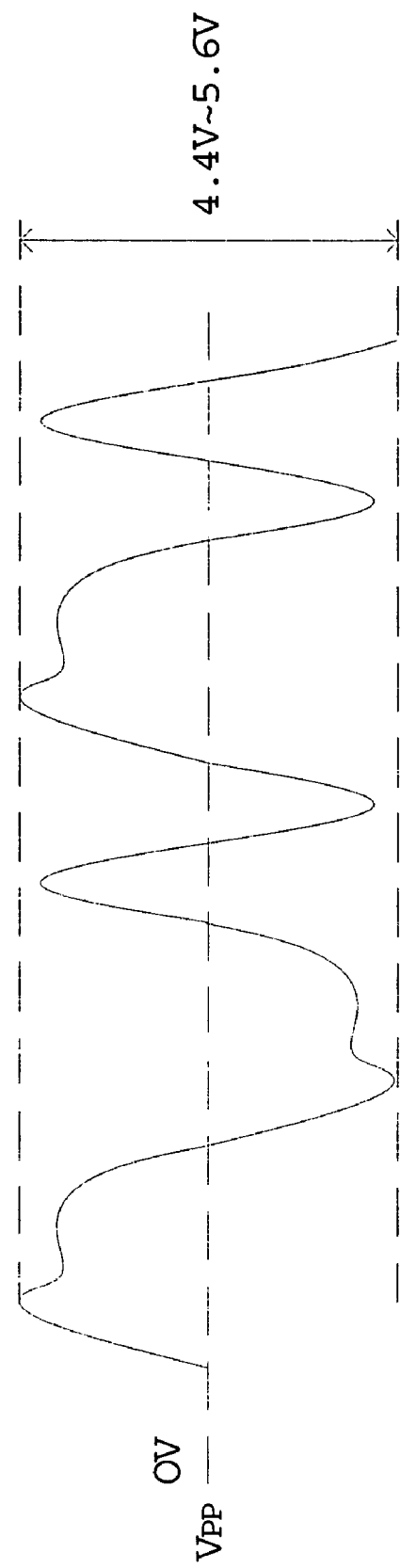
FIG. 1 (Prior Art) is a diagram showing the range of a differential output signal $V_{pp}$ of the conventional transceiver output port of a 10BASE-T Ethernet communication system according to the IEEE 802.3 standard.
Figure 2:
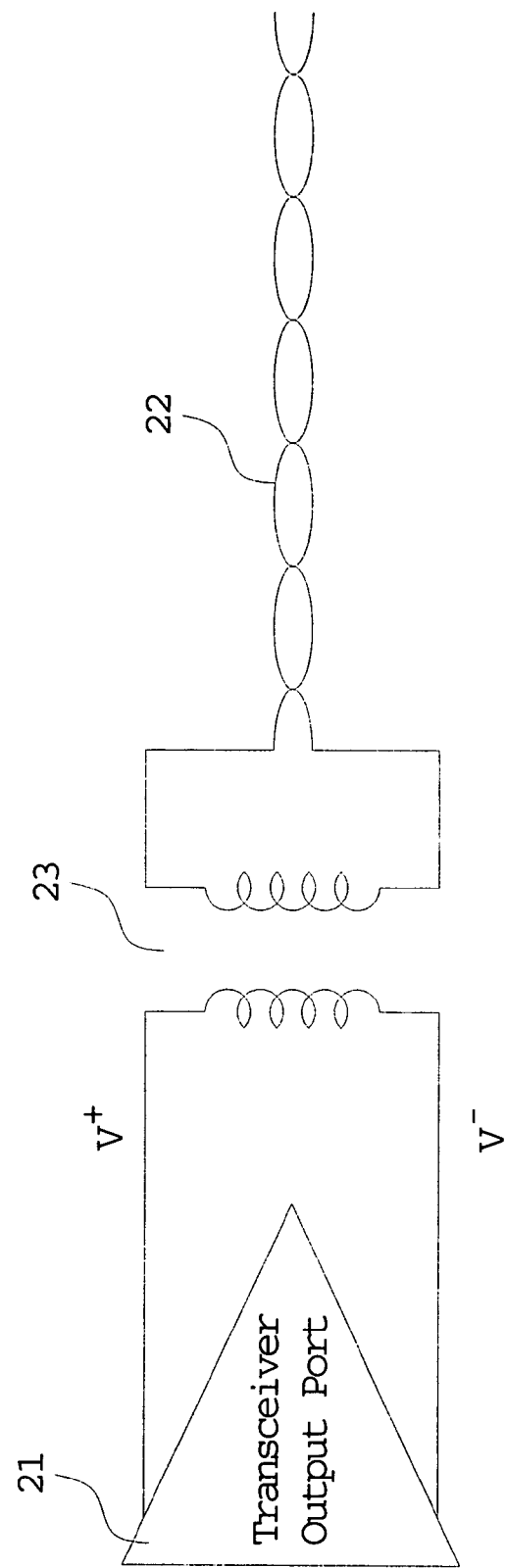
FIG. 2 (Prior Art) is a schematic diagram showing the transceiver output port of the local area networking device which is coupled to a UTP cable via a transformer.
Figure 3:
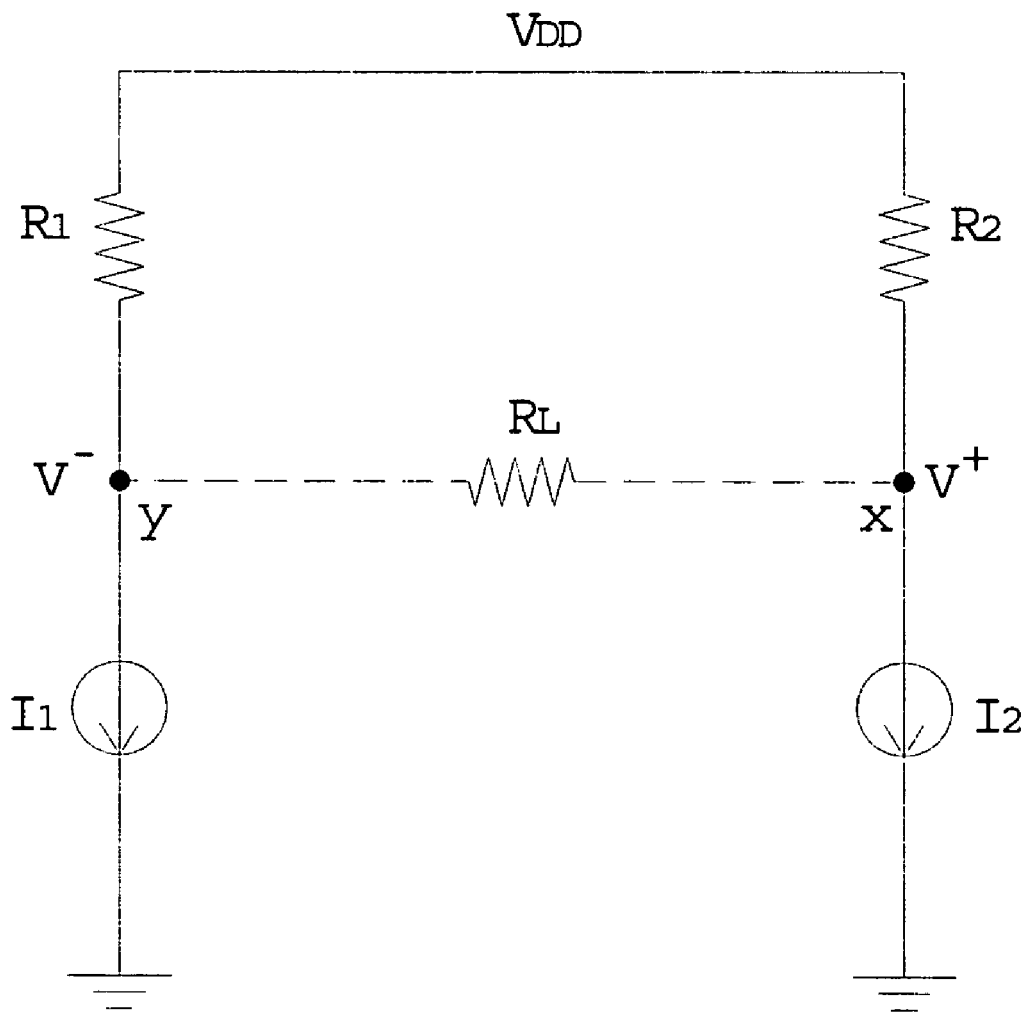
FIG. 3 (Prior Art) is a diagram showing the conventional driving circuit of the transceiver output port for a local area networking device.
Figure 4:
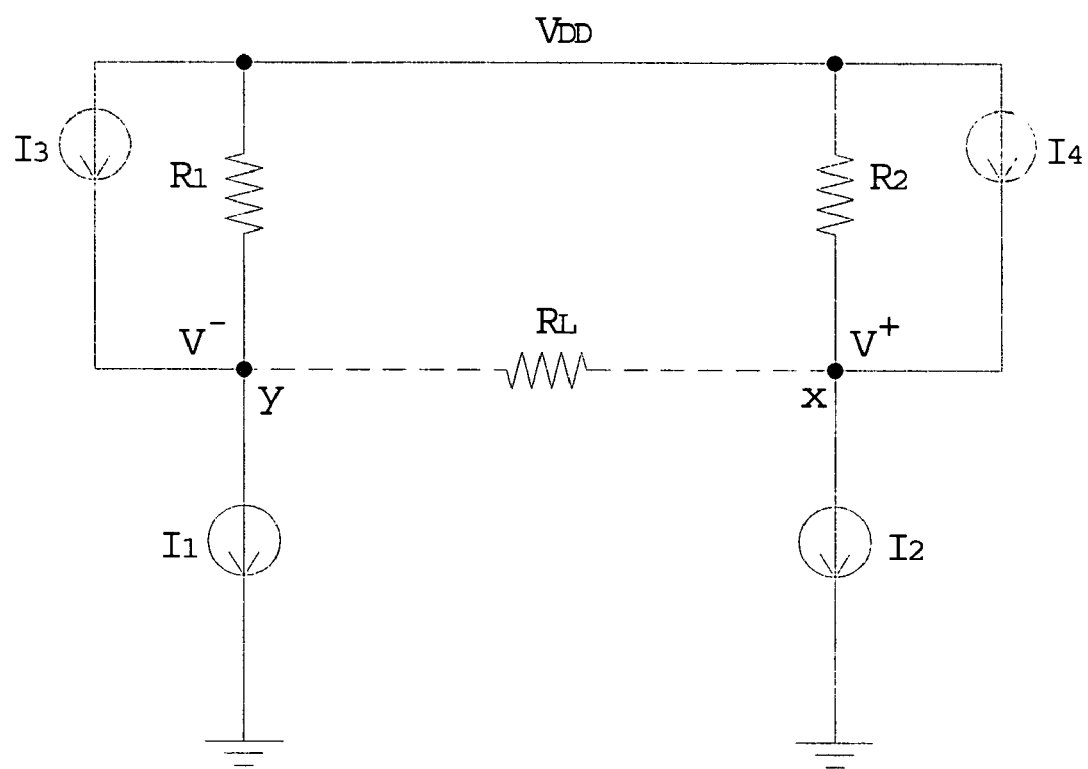
FIG. 4 is a diagram showing the driving circuit of a transceiver output port according to a first embodiment of the present invention.

FIG. 4 is a diagram showing the driving circuit of the transceiver output port according to the first embodiment of the present invention. One of the differences between the circuit illustrated in FIG. 4 and the conventional circuit as illustrated in FIG. 3 is that two additional current sources $I_3$ and $I_4$ are employed in the circuit illustrated in FIG. 4. The circuit illustrated in FIG. 4 includes four current sources $I_1$ to $I_4$. The first terminal and second terminal of the current source $I_1$ are connected to ground and one terminal of a resistor $R_1$, respectively. The other terminal of the resistor $R_1$ is connected to a supply voltage source $V_{DD}$. The first terminal and second terminal of the current source $I_2$ are connected to ground and one terminal of a resistor $R_2$, respectively. The other terminal of the resistor $R_2$ is connected to the supply voltage source $V_{DD}$. The resistors $R_1$ and $R_2$ are also impedance matching resistors for the purpose of impedance matching. The equivalent load resistance of the cable is represented by $R_L$ and is coupled between output nodes x and y, wherein the cable can be an unshielded twisted pair (UTP) cable, shielded twisted pair (STP) cable, or the like. In this embodiment, the cable is a UTP cable for illustration.

In this embodiment, the current sources $I_3$ and $I_4$ are connected to the resistors $R_1$ and $R_2$ in parallel respectively. In other words, the current source $I_3$ is coupled between the current source $I_1$ and the supply voltage source $V_{DD}$ while the current source $I_4$ is coupled between the current source $I_2$ and the supply voltage source $V_{DD}$. One of the features of the present invention is that the current sources $I_3$ and $I_4$ are employed in order to provide additional current for the driving circuit so that the magnitude of the differential output signal outputted from the transceiver output port is determined not only by the current sources $I_1$, and $I_2$ but also by the current sources $I_3$ and $I_4$. In this way, the circuit can operate particularly with a supply voltage source $V_{DD}$ at a low level, even if the supply voltage $V_{DD}$ is lower than the minimum magnitude of the supply voltage required by the conventional driving circuit.

According to IEEE 802.3 standard, $R_L$=100 Ω and $R_1$=$R_2$=50 Ω. In the following explanation, the resistance of the resistors $R_1$ and $R_2$ are both represented by R and the resistance of $R_L$ can be represented by 2R. Therefore, the resistors $R_1$ and $R_2$ can both be represented by R while $R_L$ can be represented by 2R. One of the advantages of the driving circuit shown in FIG. 4 can be explained more clearly, based on the following equations:

$$I_1 + I_2 = I_{12} \quad (11)$$

$$I_3 + I_4 = I_{34} \quad (12)$$

In this embodiment, the sum of the first current $I_1$ and the second current $I_2$, denoted by $I_{12}$, is a constant while the sum of the third current $I_3$ and the fourth current $I_4$, denoted by $I_{34}$, is also a constant. Applying Kirchhoff's voltage law at the output nodes y and x respectively, we have:

$$\frac{V_{DD} - V^-}{R} + I_3 + \frac{V^+ - V^-}{2R} = I_1 \quad (13)$$

$$\frac{V_{DD} - V^+}{R} + I_4 + \frac{V^+ - V^-}{2R} = I_2 \quad (14)$$

Summing up equations (13) and (14), equation (15) is obtained as follows:

$$\Rightarrow \frac{2V_{DD} - (V^+ + V^-)}{R} = I_1 + I_2 - I_3 - I_4 = I_{12} - I_{34} \quad (15)$$

$$\Rightarrow V^+ + V^- = 2V_{DD} - R(I_{12} - I_{34})$$

$$\Rightarrow V^- = 2V_{DD} - R(I_{12} - I_{34}) - V^+$$

Based on equations (15) and (13), equation (16) is obtained as follows:

$$2V_{DD} - 2[2V_{DD} - R(I_{12} - I_{34}) - V^+] + \quad (16)$$
$$\Rightarrow \frac{V^+ - [2V_{DD} - R(I_{12} - I_{34}) - V^+]}{2R} =$$
$$I_1 - I_3 \Rightarrow -4V_{DD} + 4V^+ + 3RI_{12} - 3RI_{34} = 2RI_1 - 2RI_3$$

$V^+$ be expressed by equation (17) which is derived from equations (11), (12), and (16), as follows:

$$\Rightarrow V^+ = V_{DD} - \frac{1}{4}RI_1 - \frac{3}{4}RI_2 + \frac{1}{4}RI_3 + \frac{3}{4}RI_4 \quad (17)$$

Moreover, $V^-$ can be represented by equation (18) which is derived from equations (17) and (15), as follows:

$$\Rightarrow V^- = V_{DD} - \frac{3}{4}RI_1 - \frac{1}{4}RI_2 + \frac{3}{4}RI_3 + \frac{1}{4}RI_4 \quad (18)$$

According to equations (17) and (18), equation (19) is obtained to represent $V^+ - V^-$ as follows:

$$\Rightarrow V^+ - V^- = \frac{R}{2}[(I_1 - I_2) - (I_3 - I_4)] \quad (19)$$

In a 10 Mbps Ethernet communication system, for example, the peak-to-peak magnitude of the differential output signal $V_{PP}$ is from ±2.2V to ±2.8V. When the differential signal is positive ($V^+>V^-$), according to equation (19), inequality (20) is obtained:

$$2.2 \le V^+ - V^- = \frac{R}{2}[(I_1 - I_2) - (I_3 - I_4)] \le 2.8 \Rightarrow \quad (20)$$
$$\frac{4.4}{R} + I_2 - I_4 \le I_1 - I_3 \le \frac{5.6}{R} + I_2 - I_4$$

According to equation (18), inequality (21) is generated:

$$\Rightarrow V^- = V_{DD} - \frac{3}{4}R(I_1 - I_3) - \frac{1}{4}R(I_2 - I_4) \ge 0 \Rightarrow \quad (21)$$
$$V_{DD} \ge \frac{3}{4}R(I_1 - I_3) + \frac{1}{4}R(I_2 - I_4)$$

Based on inequalities (20) and (21), inequality (22) is obtained as follows:

$$\Rightarrow V_{DD} \ge 3.3 + R(I_2 - I_4) \quad (22)$$

According to inequality (22), if $I_2$=0, and $$I_4 = \frac{3.3}{R},$$

$V_{DD}$ can be an arbitrary positive value. However, in practical applications, the supply voltage $V_{DD}$ is maintained within a range which enables the current sources $I_1$ to $I_4$ to operate properly. According to practical experiments, the driving circuit of the transceiver output port can operate normally when the magnitude of the supply voltage $V_{DD}$ is larger than 1V, which is much lower than the supply voltage (3.3V) required by the conventional driving circuit. Therefore, the magnitude of the differential signal outputted from the driving circuit as illustrated in FIG. 4, which is one of the embodiments of the present invention, can be sustained within a predetermined range under the supply voltage with the magnitude which is lower than that of the conventional supply voltage.

In addition, the currents required to drive the transceiver output port to output the differential output signal are provided not only by the first and second current sources $I_1$, and $I_2$, but also by the third and fourth current sources $I_3$ and $I_4$. In other words, the third and fourth current sources $I_3$ and $I_4$ provide additional currents while the first and second current sources $I_1$ and $I_2$ are operating. In this manner, the power consumption of the driving circuit of the transceiver output port can be further reduced.

In the embodiments of the present invention, the magnitude of the differential output signal is determined not only by the first and second current sources $I_1$ and $I_2$, but also by the third and fourth current sources $I_3$ and $I_4$. In the above-described embodiment, the sum of the first current $I_1$ and the second current $I_2$ ($I_{12}$) is a constant and the sum of the third current $I_3$ and the fourth current $I_4$ ($I_{34}$) is also a constant. In addition, the magnitudes of $I_{12}$ and $I_{34}$ are substantially the same. Under these conditions, the magnitudes of the first current $I_1$ and the fourth current $I_4$ are substantially the same and the magnitudes of the second current $I_2$ and the third current $I_3$ are substantially the same.

Figure 5:
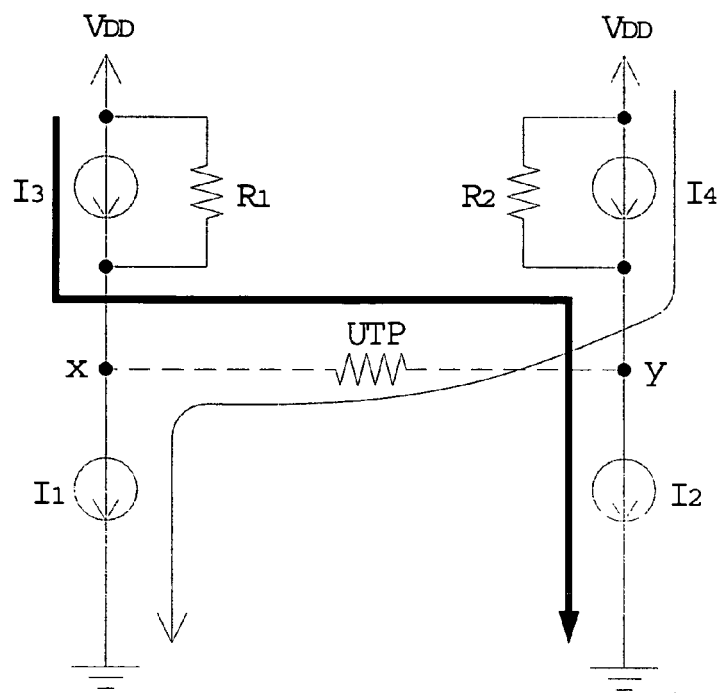
FIG. 5 is a diagram showing one of the implementations of the driving circuit of the transceiver output port shown in FIG. 4 when the differential output signal is in a first state.
Figure 6:
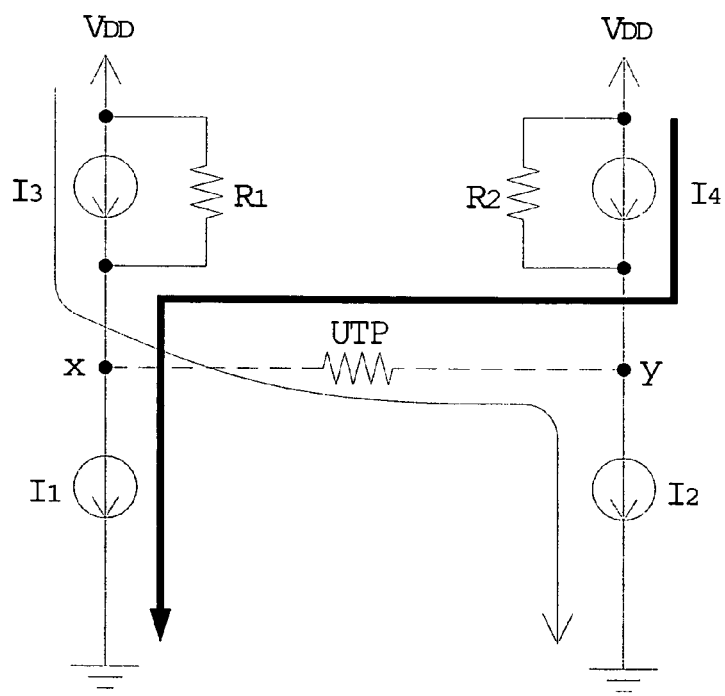
FIG. 6 is a diagram showing one of the implementations of the driving circuit of the transceiver output port shown in FIG. 4 when the differential output signal is in a second state.

Referring to FIG. 5, when the differential output signal is in a first state, i.e. $V^+>V^-$, the magnitudes of the second current $I_2$ and the third current $I_3$ are larger than those of first current $I_1$ and the fourth current $I_4$ respectively while the sum of the first current $I_1$ and the second current $I_2$ and the sum of the third current $I_3$ and the fourth current $I_4$ remain constant. Referring to FIG. 6, when the differential output signal is in a second state, i.e. $V^+<V^-$, the magnitudes of the second current $I_2$ and the third current $I_3$ are smaller than those of first current $I_1$ and the fourth current $I_4$ respectively while the sum of the first current $I_1$ and the second current $I_2$ and the sum of the third current $I_3$ and the fourth current $I_4$ remain constant.

Figure 7:
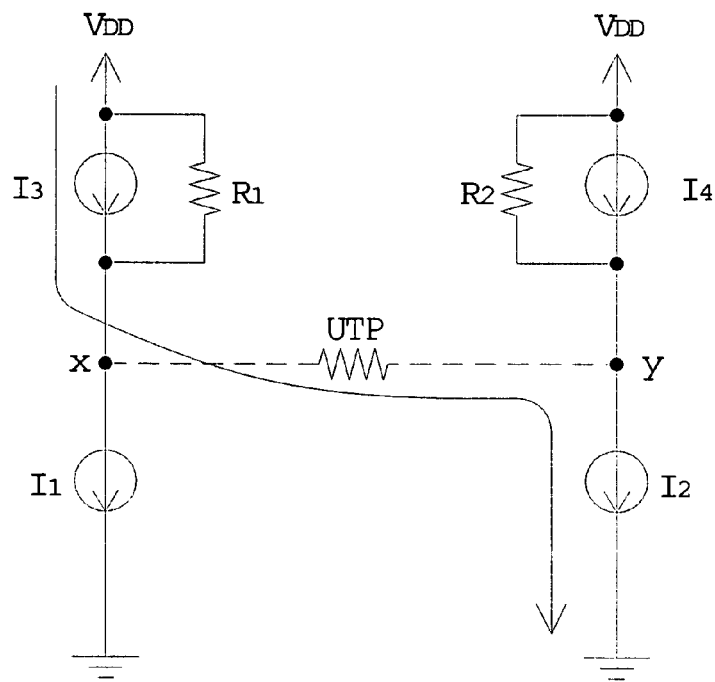
FIG. 7 is a diagram showing another one of the implementations of the driving circuit of the transceiver output port shown in FIG. 4 when the differential output signal is in a first state.
Figure 8:
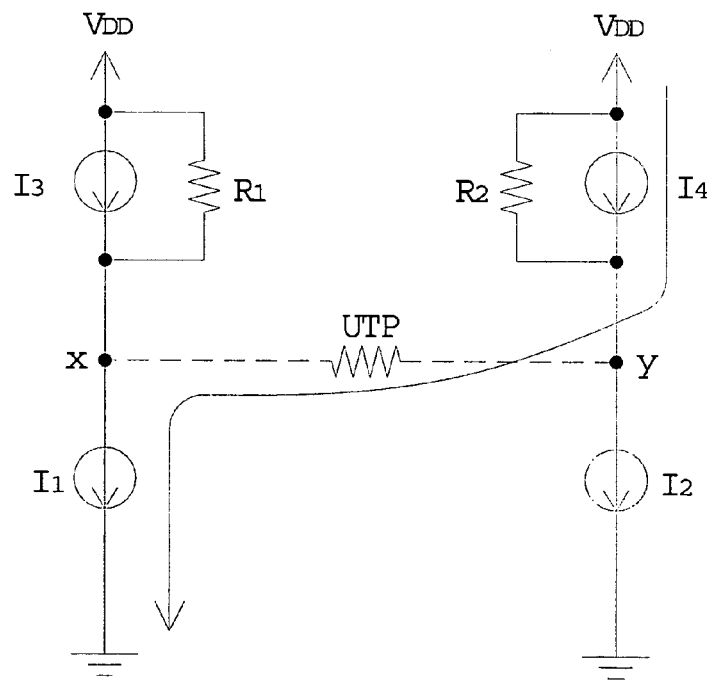
FIG. 8 is a diagram showing another one of the implementations of the driving circuit of the transceiver output port shown in FIG. 4 when the differential output signal is in a second state.

There is another implementation to determine the magnitude of the differential output signal, wherein neither the sum of the first current $I_1$ and the second current $I_2$ ($I_{12}$) nor the sum of the third current $I_3$ and the fourth current $I_4$ ($I_{34}$) are constant. Referring to FIG. 7, when the differential output signal is in a first state, i.e. $V^+>V^-$, the magnitudes of the second current $I_2$ and the third current $I_3$ are larger than those of the first current $I_1$ and the fourth current $I_4$ respectively, and the magnitudes of the first current $I_1$ and the fourth current $I_4$ are preferably zero. Referring to FIG. 8, when the differential output signal is in a second state, i.e. $V^+<V^-$, the magnitudes of the second current $I_2$ and the third current $I_3$ are smaller than those of first current $I_1$ and the fourth current $I_4$ respectively and the magnitudes of second current $I_2$ and the third current $I_3$ are preferably zero. In this manner, the power consumption of the driving circuit of the transceiver output port can be further reduced.

Figure 9:
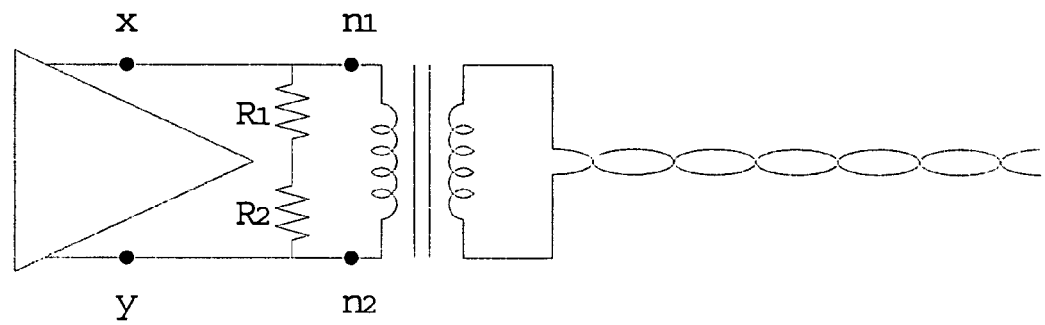
FIG. 9 is a diagram showing a local area networking device with the driving circuit of a transceiver output port shown in FIG. 10.
Figure 10:
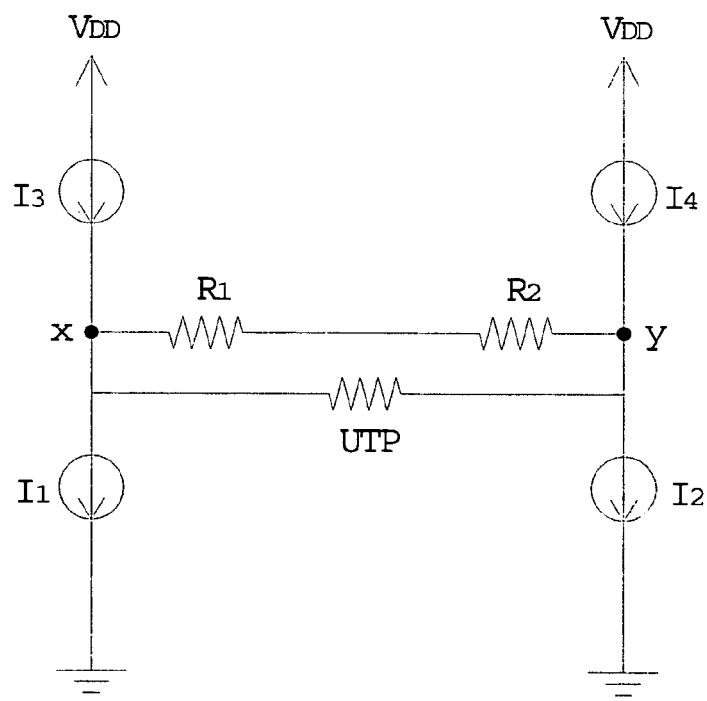
FIG. 10 is a diagram showing the driving circuit of the transceiver output port according to a second embodiment of the present invention.

It should be noted that the configuration of the impedance matching resistors, i.e. $R_1$ and $R_2$, for matching the impedance of the UTP, for example, the configuration shown in FIG. 4, is not the essential limitation of the present invention and can be implemented in different configurations with various network cabling schemes, for example, UTP or STP cable. Please refer to FIG. 9, which is a diagram showing the local area networking device with the driving circuit of the transceiver output port shown in FIG. 10. In this embodiment, the output nodes x and y of the driving circuit are coupled to first and second nodes of the transformer, $n_1$ and $n_2$, respectively, wherein the impedance matching resistors $R_1$ and $R_2$ are coupled serially between the output nodes x and y. The primary coil of the transformer is coupled to the output nodes of the driving circuit at the first and second nodes $n_1$ and $n_2$ respectively while the secondary coil of the transformer is coupled to the cable, (e.g. UTP cable), as shown in FIG. 9. The driving circuit of the transceiver output port with the implementation shown in FIG. 9 can be illustrated as FIG. 10, which is the second embodiment of the present invention. The difference between this embodiment and the first embodiment shown in FIG. 4 is the configuration of the impedance matching resistors $R_1$ and $R_2$. Besides, this embodiment and the first embodiment both have a common feature that the currents required to drive the transceiver output port to output the differential output signal are provided not only by the first and second current sources $I_1$ and $I_2$, but also by the third and fourth current sources $I_3$ and $I_4$. In other words, the third and fourth current sources $I_3$ and $I_4$ provide additional currents while the first and second current sources $I_1$ and $I_2$ are operating. In this manner, the magnitude of the differential output signal is determined not only by the first and second current sources $I_1$ and $I_2$, but also by the third and fourth current sources $I_3$ and $I_4$.

Figure 11:
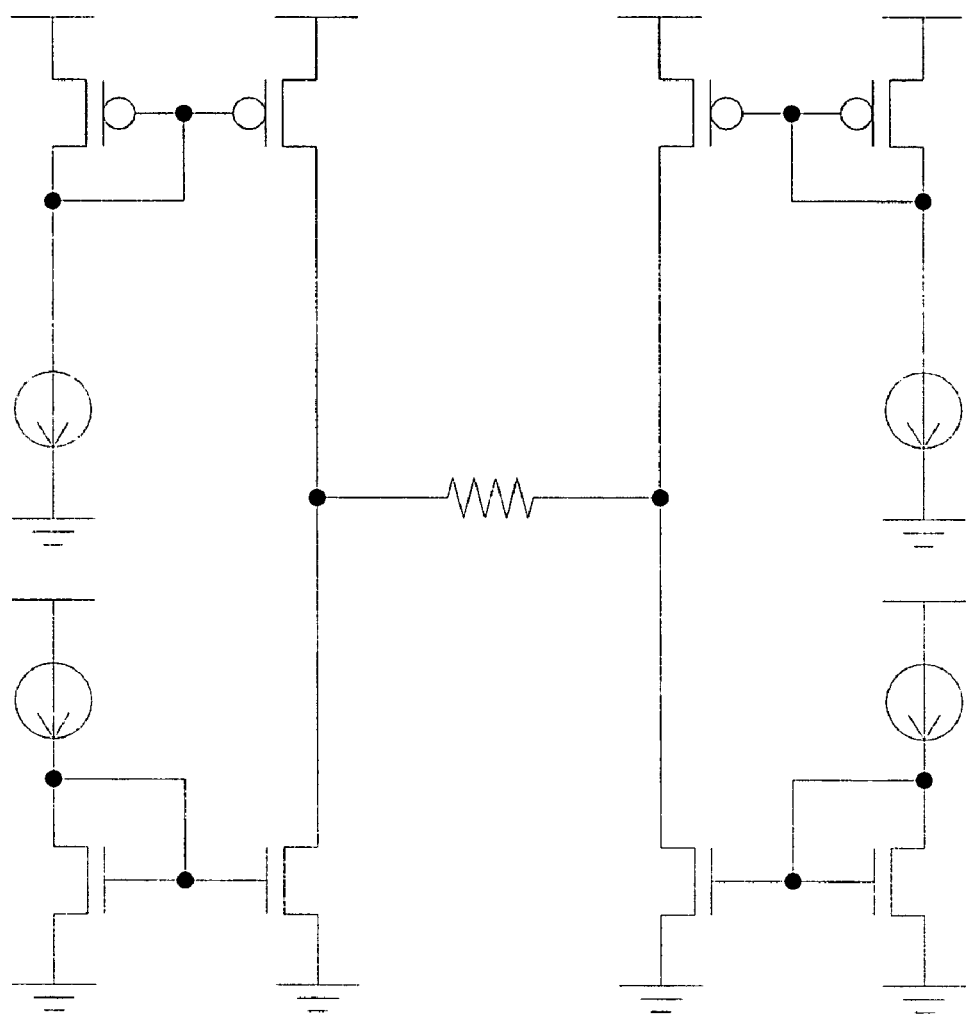
FIGS. 11–15 are diagrams showing various implementations of the current sources of the driving circuit of the transceiver output port according to the embodiments of the present invention.
Figure 12:
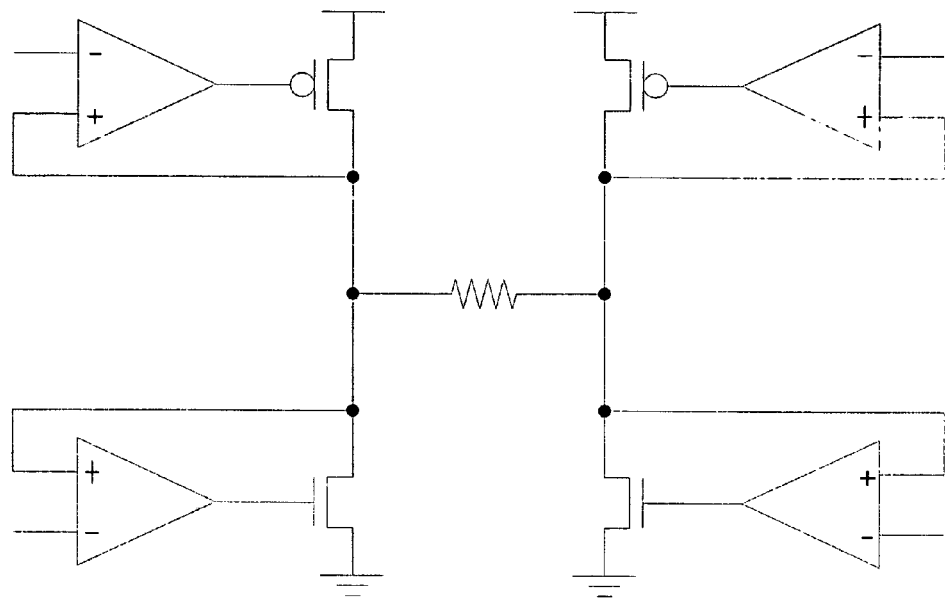
Figure 13:
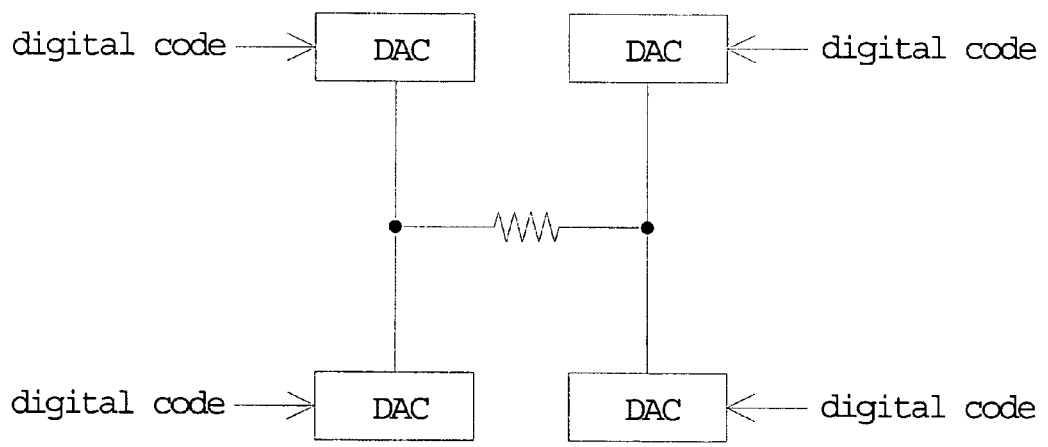
Figure 14:
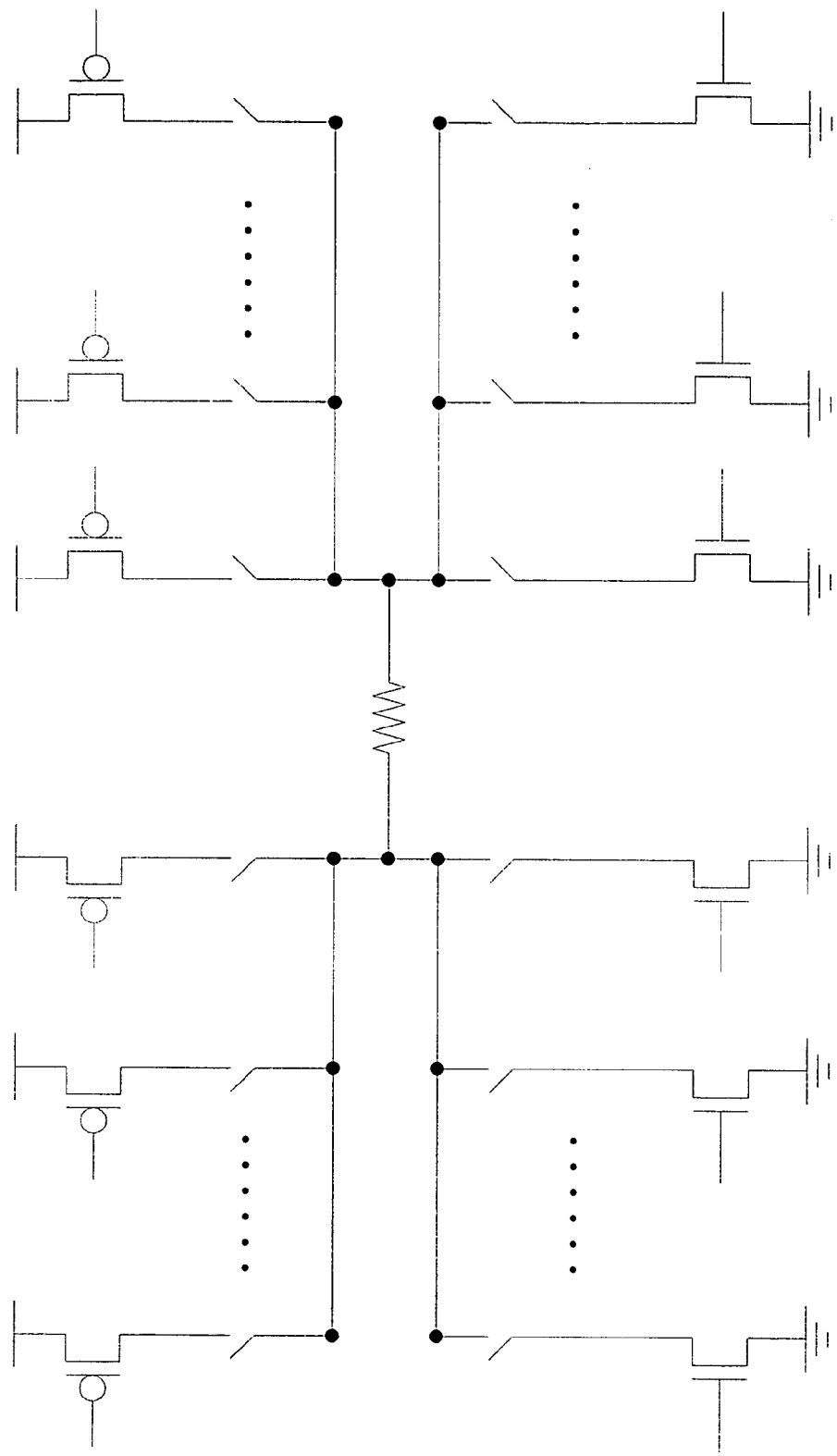
Figure 15:
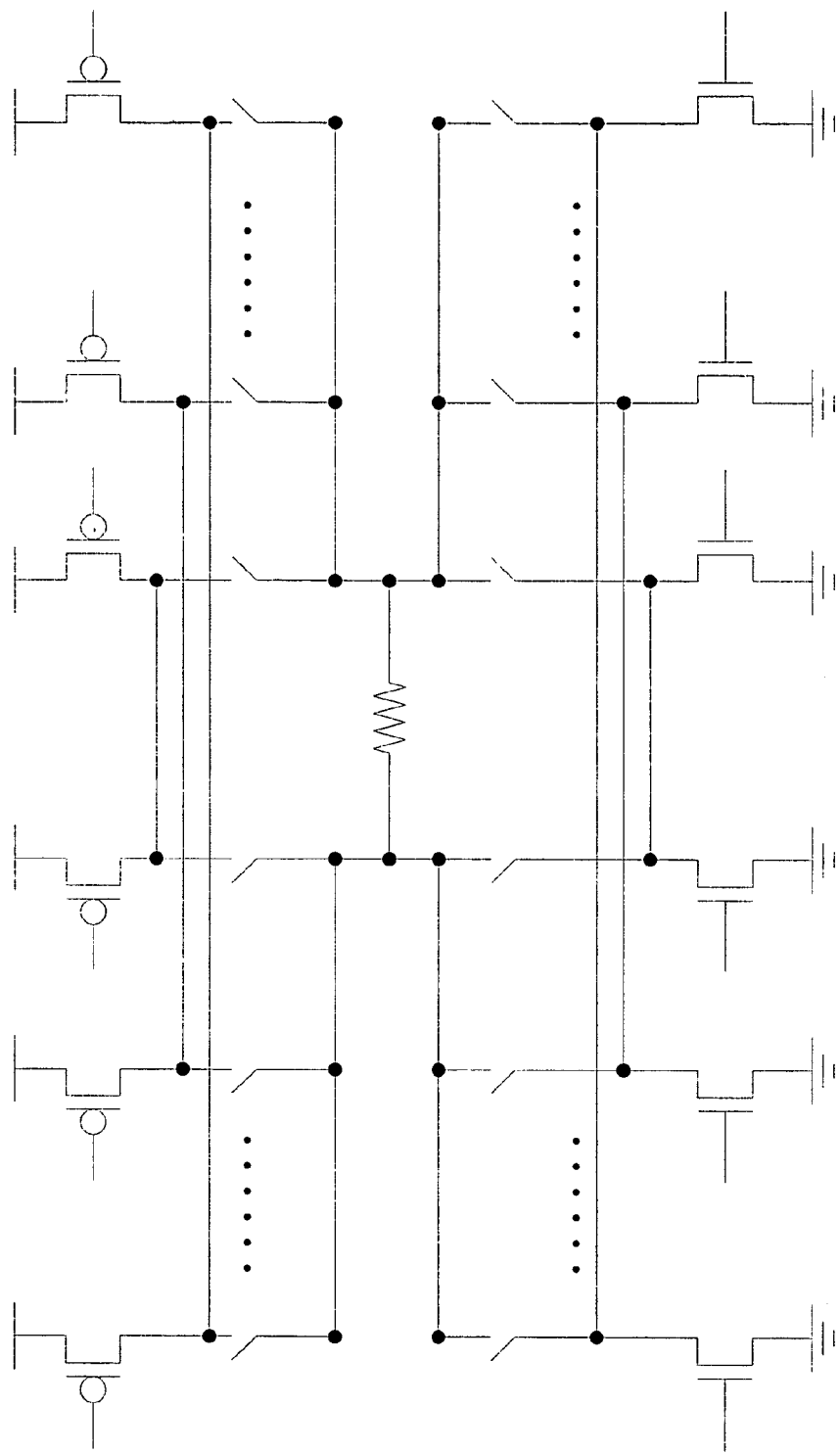

There are various ways to implement the current sources of the embodiments of the present invention. For example, each of the current sources can be implemented as a current mirror, as shown in FIG. 11, a voltage controlled current source, as shown in FIG. 12, or a current steering digital-to-analog converter (DAC), as shown in FIG. 13. Two of the embodiments of the current steering digital-to-analog converters (DAC) of FIG. 13 are shown in FIG. 14 and FIG. 15.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A driving circuit of a transceiver output port of a local area networking device, wherein the transceiver output port is coupled to a cable and the driving circuit is for outputting a differential output signal to the cable, the driving circuit comprising:

a first output node;

a second output node, wherein the first and second output nodes are for outputting the differential output signal;

a first current source coupled to the first output node for providing a first current;

a second current source coupled to the second output node for providing a second current;

a first resistor coupled to the first output node;

a second resistor coupled to the second output node;

a third current source coupled between the first output node and a supply voltage source for providing a third current; and a fourth current source coupled between the second output node and the supply voltage source for providing a fourth current;

wherein the resistance of the first resistor and the resistance of the second resistor each are equal to ½ of the equivalent resistance of the cable for the purpose of impedance matching to the cable, and wherein the third and fourth current sources are used for providing currents while the first and second current sources are operating such that the magnitude of the differential output signal is determined not only according to the first and second currents but also according to the third and fourth currents.

2. The driving circuit of claim 1, wherein the first resistor is coupled between the first output node and the supply voltage source and the second resistor is coupled between the second output node and the supply voltage source.

3. The driving circuit of claim 1, wherein the first and second resistors are coupled serially between the first and second output nodes, the transceiver output port is coupled to the cable via a transformer, and the transformer is coupled to the first and second output nodes.

4. The driving circuit of claim 1, wherein the resistance of each of the first and second resistors is substantially 50 Ohm.

5. The driving circuit of claim 1, wherein the magnitude of the fourth current is substantially the same with the magnitude of the first current, and the magnitude of the third current is substantially the same with the magnitude of the second current.

6. The driving circuit of claim 5, wherein when the differential output signal is in a first state, the magnitudes of the first and fourth currents are larger than the magnitudes of the second and third currents respectively; and when the differential output signal is in a second state, the magnitudes of the first and fourth currents are smaller than the magnitudes of the second and third currents.

7. The driving circuit of claim 6, wherein the sum of the first current and the second current is a constant and the sum of the third current and the fourth current is also the constant.

8. The driving circuit of claim 6, wherein when the differential output signal is in the first state, the magnitudes of the second current and the third current are both zero; and when the differential output signal is in the second state, the magnitudes of the first current and the fourth current are both zero.

9. The driving circuit of claim 1, wherein at least one of the first, the second, the third, and the fourth current sources is a current mirror.

10. The driving circuit of claim 1, wherein at least one of the first, the second, the third, and the fourth current sources is a voltage controlled current source.

11. The driving circuit of claim 1, wherein at least one of the first, the second, the third, and the fourth current sources is a digital-to-analog converter (DAC).

12. The driving circuit of claim 1, wherein the cable is an unshielded twisted pair (UTP) cable.

13. The driving circuit of claim 1, wherein the cable is a shielded twisted pair (STP) cable.

14. A driving circuit for a transceiver output port of a local networking device, the local networking device including first and second output nodes for communicating with a cable coupled between the first and second output nodes, for providing a differential output signal, the driving circuit comprising:

a supply voltage source for providing a supply voltage;

a first current source coupled between the first output node and ground;

a second current source coupled between the second output node and ground; wherein the resistor unit includes a first resistor coupled to the first output node and a second resistor coupled to the second output node;

a third current source coupled between the first output node and the supply voltage source;

a fourth current source coupled between the second output node and the supply voltage source; and wherein the magnitude of the differential output signal is determined not only according to the first and second currents but also according to the third and fourth currents.

15. The driving circuit of claim 14, wherein the resistance of each of the first resistor and second resistors is one half of the impedance of the UTP.

16. The driving circuit of claim 14, wherein the cable is an unshielded twisted pair (UTP) cable.

17. The driving circuit of claim 14, wherein the cable is a shielded twisted pair (UTP) cable.

18. The driving circuit of claim 14, wherein most current provided by the third current source flows into the output node.

19. The driving circuit of claim 18, wherein most current provided by the fourth current source flows into the second output node.

20. A driving circuit for a transceiver output port of a local area networking device, the driving circuit comprising:

first and second output nodes for outputting a differential output signal to a network cable;

an equivalent output resistor that matches an impedance of the network cable, wherein the equivalent output resistor comprises a first resistor and a second resistor for matching the impedance of the network cable;

a supply voltage source for providing a supply voltage;

a first current source coupled between the first output node and ground;

a second current source coupled between the second output node and ground;

a third current source coupled between the first output node and the supply voltage source; and a fourth current source coupled between the second output node and the supply voltage source;

wherein the third and fourth current sources are used for providing currents while the first and second current sources are operating.

21. The driving circuit of claim 20, wherein the magnitude of the differential output signal is determined not only according to the first and second currents but also according to the third and fourth currents.

22. The driving circuit of claim 20, wherein the local area networking device is compliant with the Ethernet standard and the network cable is an unshielded twisted pair cable.

23. The driving circuit of claim 20, wherein the local area networking device is compliant with the Ethernet standard and the network cable is a shielded twisted pair cable.

24. The driving circuit of claim 20, wherein most current provided by the third current source flows into the first output node.

25. The driving circuit of claim 24, wherein most current provided by the fourth current source flows into the second output node.

* * * * *